United States Patent [19]
Irikawa et al.

[11] Patent Number: 5,789,760
[45] Date of Patent: Aug. 4, 1998

[54] MULTIQUANTUM BARRIER SCHOTTKY JUNCTION DEVICE

[75] Inventors: Michinori Irikawa, Yokohama; Kenichi Iga, Tokyo-to, both of Japan

[73] Assignee: The Furukawa Electric Co., Ltd., Tokyo, Japan

[21] Appl. No.: 422,831

[22] Filed: Apr. 17, 1995

Related U.S. Application Data

[63] Continuation-in-part of Ser. No. 57,757, May 7, 1993, abandoned.

[30] Foreign Application Priority Data

May 8, 1992 [JP] Japan ................................ 4-143420

[51] Int. Cl.$^6$ ........................ H01L 29/06; H01L 31/0328
[52] U.S. Cl. .......................... 257/15; 257/17; 257/18; 257/189; 257/190
[58] Field of Search ........................... 257/15, 17, 18, 257/189, 190

[56] References Cited

U.S. PATENT DOCUMENTS

| | | | |
|---|---|---|---|
| 5,034,794 | 7/1991 | Murotani | 357/30 |
| 5,053,843 | 10/1991 | Choudhury et al. | 357/30 |
| 5,096,846 | 3/1992 | Randall | 437/40 |
| 5,105,248 | 4/1992 | Burke et al. | 357/24 |
| 5,208,695 | 5/1993 | Dutta | 359/245 |

FOREIGN PATENT DOCUMENTS

| | | |
|---|---|---|
| 0 299 841 | 1/1989 | European Pat. Off. |
| 63-116471 | 5/1988 | Japan |
| 2-199877 | 8/1990 | Japan |

OTHER PUBLICATIONS

Fritz et al., "Novel reflectance modulator employing an InGaAs/AlGaAs strained layer super lattice Fabry–Perot cavity with unstrained InGaAs/InAlAs mirrors", Appl. Phys. Lett. vol. 58, No. 15, 15 Apr. 1991.
Iga, K. et al. Electron. Lett. vol. 22, 1008 (1986).
Morgan, D.V. et al. Electron. Lett. vol. 14, 737 (1978).

*Primary Examiner*—Valencia Martin Wallace
*Attorney, Agent, or Firm*—Jacobson, Price, Holman & Stern, PLLC

[57] ABSTRACT

There is provided a semiconductor device comprising a Schottky junction having a very low leakage current and a high forward voltage. The device comprises a Schottky junction realized by a semiconductor 4 and a metal 6 and a multiquantum barrier structure 5 disposed on the interface of said semiconductor 4 and said metal 6 and having an effect of reflecting incident carriers as waves [in phase conditions capable of allowing mutual enhancement of the incident and reflected waves].

3 Claims, 4 Drawing Sheets

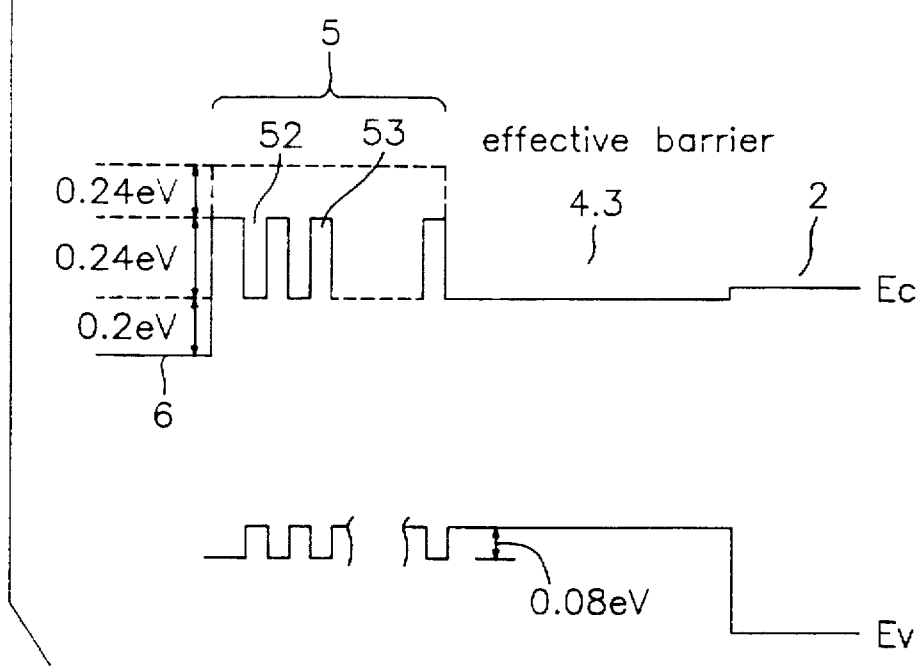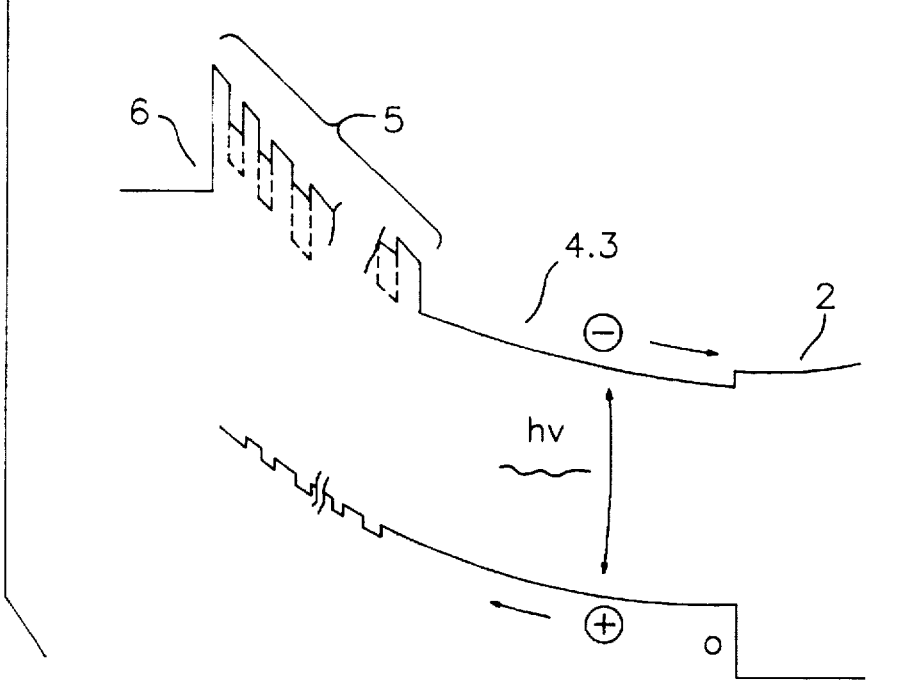

MULTIQUANTUM BARRIER SCHOTTKY JUNCTION DEVICE

This is a continuation-in-part of application Ser. No. 08/057,757, filed May 7, 1993, abandoned.

BACKGROUND OF THE INVENTION

1. Field of Invention

This invention relates to a multiquantum barrier Schottky junction device having a Schottky junction composed of semiconductor and metal.

2. Prior Art $In_{0.53}Ga_{0.47}As$ which is lattice-matched to InP has a number of remarkable characteristics including large mobility, large saturation velocity and a band gap as small as 0.47 eV so that it can absorb light in a wavelength region between 1.3 and 1.65 μm which is typically used for optical communication.

Because of these characteristic features, High Electron Mobility Transistor (HEMT) and photo diodes utilizing a Schottky junction consisting of $In_{0.53}Ga_{0.47}As$ and metal have been extensively developed and discussed so far.

Such a Schottky junction is, however, accompanied by certain problems including a low barrier height and a large leakage current. Several proposals have been made to overcome these problems.

One is the use of a $SiO_2$ layer at the Schottky junction interface as described in Paper No. 1 listed below.

Another is the use of an $n-In_{0.52}Al_{0.48}As$ layer at the Schottky junction layer as described in Paper No. 2 also listed below.

Still another is the use of a graded superlattice of $In_{0.53}Ga_{0.47}As/In_{0.52}Al_{0.48}As$ as described in Paper No. 3 also listed below.

In a graded superlattice of $In_{0.53}Al_{0.47}As/In_{0.52}Ga_{0.48}As$, the thickness of the $In_{0.53}Ga_{0.47}As$ films was gradually decreased from semiconductor to metal side. On the contrary, that of the $In_{0.52}Al_{0.48}As$ layers was increased in the same direction.

Paper No. 1: D. V. Morgan et al., Electron. Lett. 14, 737 (1978)

Paper No. 2: J. Barrard et al., IEEE Electron Device Lett. EDL-1, 174 (1980)

Paper No. 3: D. H. Lee et al., Appl. Phys. Lett. 19, 1863 (1989)

PROBLEMS TO BE SOLVED BY THE INVENTION

Referring to Paper No. 3 above, when a graded superlattice is inserted between a metal layer and a semiconductor layer ($n-In_{0.53}Ga_{0.47}As$) by using the technique described there, the Schottky barrier of the obtained device will show a height of 0.71 eV or a net increase of about 0.51 eV, if the metal is Au (gold).

The reason for the increase in the Schottky barrier height is attributed to an increase in the effective bandgap that represents the average composition of the superlattice involved. That is, the effective band gap of the superlattice adjacent to the metal is 1.40 eV, which is by 0.65 eV higher than the band gap of $In_{0.53}Ga_{0.47}As$ and therefore the Schottky barrier height is increased by 0.65 eV×0.78=0.507 eV (experimentally 0.51 eV).

The technique described in Paper No. 3, however, cannot provide a barrier height that exceeds the Schottky barrier height which is determined by the effective bandgap (or the effective electronic affinity) which is a physical constant specific to the material of the graded superlattice involved.

The object of present invention to provide a Schottky junction device which realizes a Schottky barrier height greater than that determined by the material constants such as electron affinities of the material involved and, which consequently, realizes extremely small leakage current.

SUMMARY OF THE INVENTION

According to the invention, the above object and other objects of the invention are achieved by providing a multiquantum barrier Schottky junction device loaded by a multiquantum barrier comprising a semiconductor and a metal and a multiquantum barrier (CMQB) structure disposed on the interface of said semiconductor and said metal and having an effect of reflecting electrons injected into said MQB from said metal as quantum mechanical waves.

The multiquantum barrier structure of a device according to the invention preferably comprises a strained layer superlattice.

Here, the principle and designing method of MQB are described in detail.

As is known well in quantum mechanics, the incident wave and the reflected (scattered) wave of a particle which collides with a potential well or a potential barrier can interfere so long as they are coherent [1].

(1) Quantum Mechanics, L. A. Schiff. (McGraw-Hill, N.Y. 1955)

Similarly, in semiconductor material, an electron wave which is incident upon a superlattice structure can also interfere with its reflected wave so that the total reflection (reflectivity=1) can be realized, if suitable conditions are satisfied. This is a concept of MQB (Paper 4), as is shown in FIG. 3(a).

The model and designing procedures are summarized as follows:

(1) The potential model described by the conduction band edge discontinuity (FIG. 3 (b)).

(2) One dimensional Schroedinger equation under effective mass approximation, where the parabolic band model, i.e., $(E-V)=(\hbar k)^2/2m\ddagger$ is usually assumed (Eq (1)).

$$\left[ -\frac{\hbar^2}{2} \cdot \frac{d}{dx} \cdot \frac{1}{m^*(x)} \cdot \frac{d}{dx} + V(x) \right] U(x) = Eu(x),$$

$$u_j(x) = A_j e^{ik_j(x-x_{j-1})} + B_j e^{-ik_j(x-x_{j-1})},$$

$$k_j = \sqrt{\frac{2m_j^*}{\hbar^2}(E-V_j)}$$

Eq (1)

(3) Transfer matrix method, where the boundary conditions are i) continuity of probability density and ii) continuity of flux (Eq (2)).

$$\begin{cases} u_{j-1}(x_{j-1}) = u_j(x_{j-1}), \\ \frac{1}{m^*_{j-1}} \cdot \frac{d}{dx}[u_{j-1}(x_{j-1})] = \frac{1}{m^*_j} \cdot [u_j(x_{j-1})] \end{cases}$$

Eq (2)

In addition to the above potential model, and equations, the effect of the electric field brought by the depletion region must be taken into account in the case of MQB loaded at Metal-semiconductor interface.

The band diagram or the conventional Schottky diode is shown in FIG. 3(c) The maximum electric field Em of the depletion region near the metal as given by Eq (3);

$$Em=2(V_R+V_{oi})/W \qquad \text{Eq (3)}$$

where, $V_{bi}$ is the built-in voltage, $V_R$ is the reverse bias voltage to the thickness of the depletion region.

The electric filed in the MQB region can be approximated by the maximum electric field Em, since the total layer thickness of MQB (about 50 nm) is much smaller than the thickness W of the depletion layer (=1–2 μm).

Now the electric field given by Eq (3) is superimposed onto above one dimensional potential model shown in FIG. 3(b) An example of the superimposed potential is shown in FIG. 3(d).

The method described above gives the reflectivity R(E) of an incident carrier as a function of energy E of an incident carrier, layer thickness, potential height including the effect of the electric field, effective mass of carrier for each layer consisting of the MQB structure.

Thus, by calculating reflectivity R(E) as a function of incident energy E, we can obtain a reflection spectrum for a certain MQB structure.

Paper No. 4: Iga et al., Electron. Lett. 22, 1008 (1986)

BRIEF DESCRIPTION OF THE DRAWINGS

FIG. 2(a) is a schematic illustration of the energy band diagram for a second embodiment of semiconductor device of the invention, which is in fact a photo diode.

FIG. 2(b) is a schematic illustration of the flow of carriers in the photo diode of FIG. 2(a).

DESCRIPTION OF THE PREFERRED EMBODIMENTS

Now, the present invention will be described in detail by referring to the accompanying drawings that illustrate preferred embodiments of the invention.

Figure 1A:
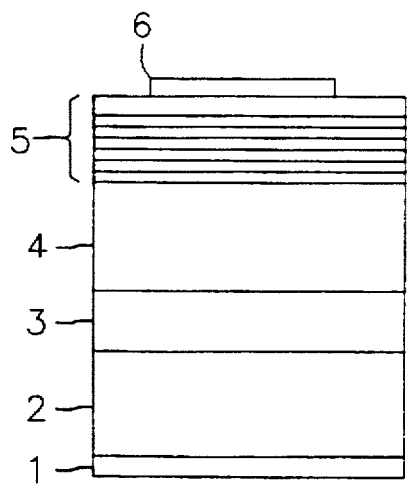
FIG. 1(a) is a schematic cross sectional view of a first embodiment of semiconductor device of the present invention, which is in fact a Schottky barrier diode.

FIG. 1(a) is a schematic cross sectional view of a first embodiment of semiconductor device of the present invention, which is in fact a Schottky barrier diode.

The Schottky barrier diode of FIG. 1(a) is realized by replacing the graded superlattice of a device described in the above cited Paper No. 3 with a multiquantum barrier (MQB) layer.

Referring to FIG. 1(a), 1 denotes an Au/Ge-Ni-Au ohmic electrode, 2 an n+-InP substrate, 3 a 0.5 μm thick n+-In$_{0.53}$Ga$_{0.47}$As layer, 4 a 1.5 μm thick n-In$_{0.53}$Ga$_{0.47}$As layer, 5 an MQB layer and 6 an Au Schottky electrode.

Figure 1B:
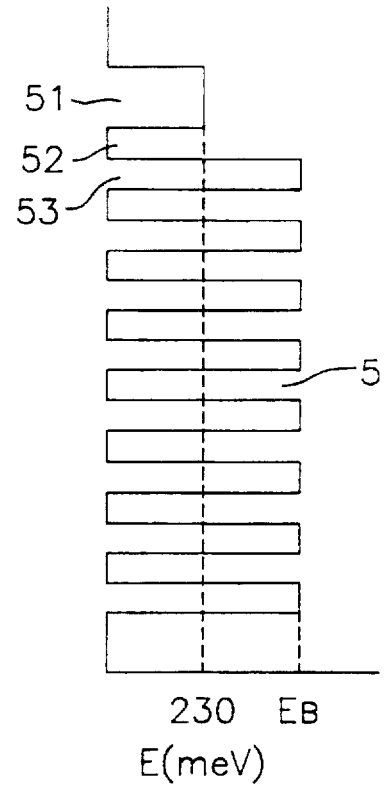
FIG. 1(b) is a schematic illustration of the energy band diagram for the conduction band edge of the MQB region 5 in the Schottky barrier diode of FIG. 1(a).

As illustrated in FIG. 1(a), the MQB layer 5 consists of a (1) 60-monolayer (ML) thick n-InP layer 51, eight (8) GaInAs well layers 52, each being 5-ML thick, and eight (8) Al$_x$In$_{1-x}$As barrier layers 53, each having a thickness of 5-ML, the layers are all nondoped, the energy band diagram being as illustrated in FIG. 1(b) for the conduction band edge.

Note that, for the purpose of the present invention, GaInAs is used as the reference for determining the energy level of the conduction band edge of various materials.

Also note that two different MQBs having AlInAs barrier layers of Aluminum content of X=0.48 (hereinafter referred to as MQB1) and of X=0.62 (hereinafter referred to as MQB2) are used.

The lattice constant of barrier layer of MQB1 matches to that of InP and the energy level $E_5$ of the barrier layer 53 is 500 meV for conduction band edge.

The barrier layer of MQB2 has a 1% in-plane tensile strain and the energy level $E_5$ of the barrier layer 53 is 770 meV.

The theoretical base and the effect of using such a strained superlattice was disclosed by the inventors of the present invention in Japanese Patent Application No. 2-305785 and Paper No. 5 as listed below.

Paper No. 5: M. Irikawa et al: Jpn. J. Appl. Phys. 31 (1992) L1351

The changes in the band edge energy level are reported in Paper No. 6 listed below.

Paper No. 6: F. L. Schuenmeyer et al., Appl. Phys. Lett. 55, 1877 (1989)

The thickness of each layer of superlattice part of the MQB usually falls in the region of 4 ML to 10 ML. On the other hand, the thickness of well or barrier of conventional MQW is larger than 10 ML.

Figure 1C:
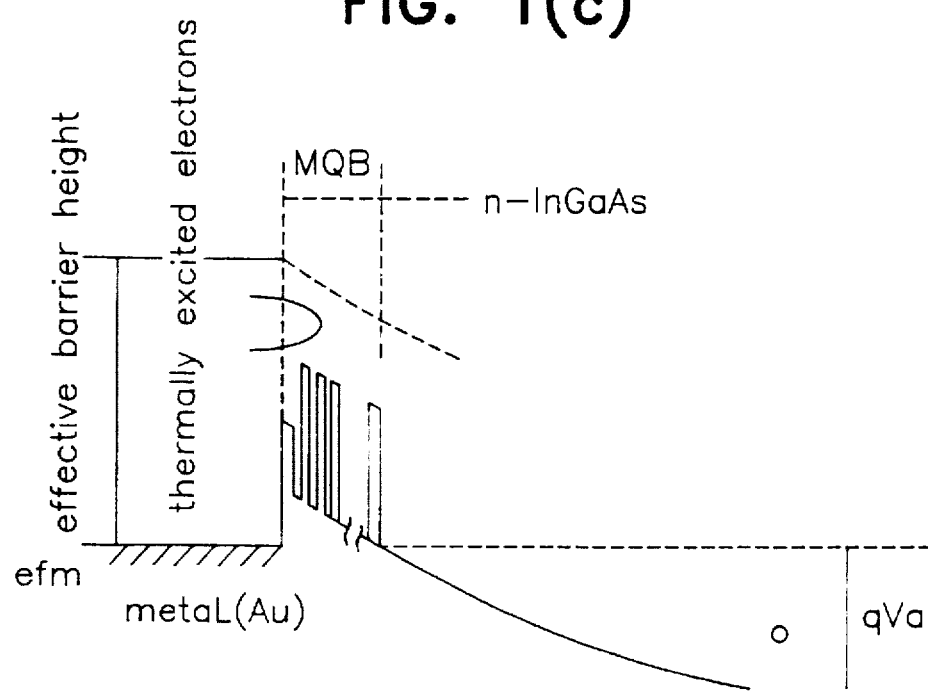
FIG. 1(c) is a schematic illustration of the relationship between the energy level of the incident electrons and effective potential height of the MQB when the Schottky barrier diode of FIG. 1(a) is reversely biased.
Figure 3A:
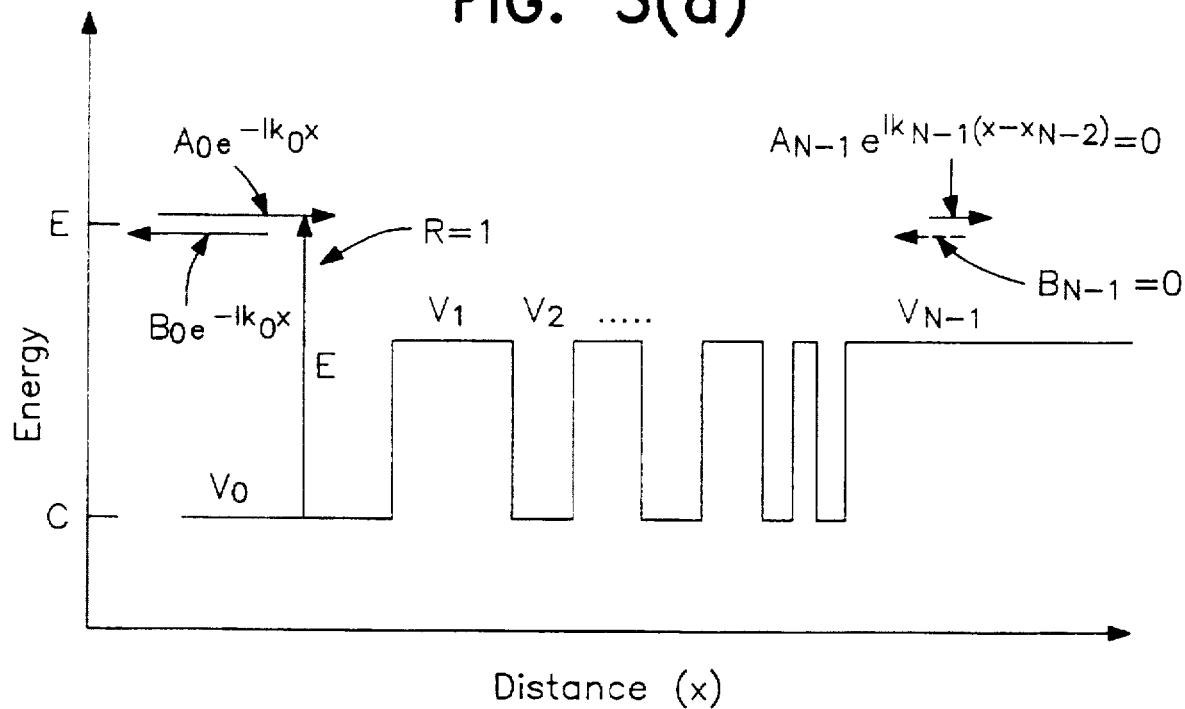
FIG. 3(a) is a schematic illustration of the concept of MQB.
Figure 3B:
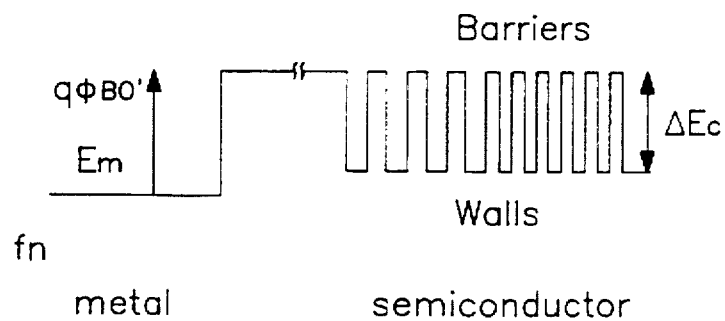
FIG. 3(b) is a schematic illustration of one dimensional potential model for an MQB-Schottky diode.
Figure 3C:
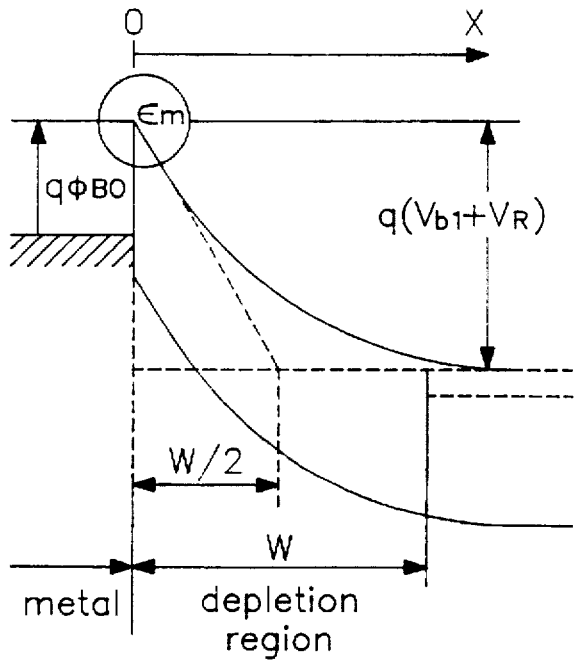
FIG. 3(c) is a band diagram of the conventional Schottky diode.
Figure 3D:
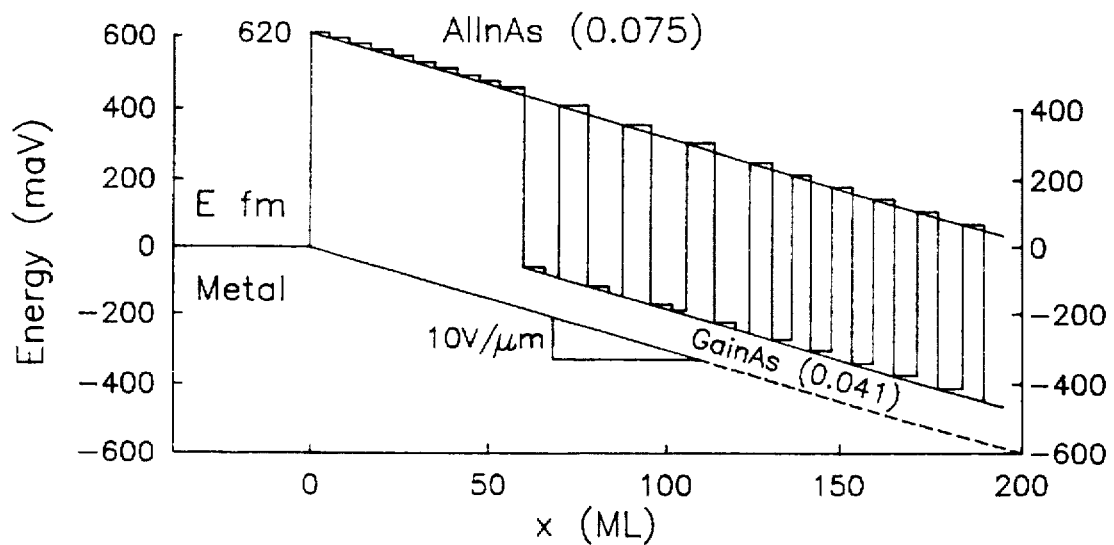
FIG. 3(d) is an example of the potential model of an MQB-Schottky under electric field.

FIG. 1(c) schematically illustrates the energy band diagram of a Schottky junction with MQB under reverse bias condition.

Leakage current is caused by thermionic electrons injected into the semiconductor from the metal, crossing over the Schottky barrier.

An MQB as illustrated in FIG. 1(c) provides an effective barrier height which is sufficiently higher than the actual barrier height to block such electrons.

The inventors of the present invention calculated the effective barrier height for both the above described MQB1 and MQB2 by using a transfer matrix method (TMM) as described earlier.

The results of the calculation will now be described.

An effective barrier height higher than n-InGaAs by about 1.0 eV was obtained for MQB1. Thus, it is possible to provide a Schottky barrier height of 1.2 eV for Au (gold).

An effective barrier height higher than n-InGaAs by about 1.5 eV was obtained for MQB2. Thus, it is possible to provide a Schottky barrier height of 1.7 eV for Au (gold).

By comparing these barrier heights with the value disclosed in the above cited Paper No. 3, or 0.71 eV, MQB1 provides a barrier height greater than it by 0.5 eV, whereas MQB2 provides a barrier height greater than it by about 1.0 eV.

In general terms of the thermionic electron emission theory, the saturation leak current $J_{ST}$ of a Schottky junction under a reversely biased condition is attributed to thermionic electrons injected from the metal into the semiconductor, crossing over the Schottky barrier, and expressed by the formula below.

$$J_{st} \propto \exp(-q\, \phi_{sr}/kT)$$

where q $\phi_{sn}$ is the Schottky barrier height.

When the above formula is applied to the present embodiment and the obtained leak current is compared with that of the above cited Paper No. 3, it will be seen that the leak current for MQB1 is reduced by $\exp(-0.5/0.026)=:10^{-9}$, while the leak current for MQB2 is reduced by $\exp(-1.0/0.026)=:10^{-17}$.

Thus, the above embodiment of the present invention proves to be a Schottky barrier diode having a very low leak current.

While electrons are injected from the metal into the semiconductor of the device under a reversely biased condition in the above description, a Schottky junction having a high forward voltage can be realized when the same principal is applied to electrons injected from the semiconductor into the metal of the device.

While $Al_xIn_{1-x}As$ (x=0.48 or x=0.62) is used as the material of the MQBs in the above embodiment, a same or similar effect may be obtained so long as x is found to be $0.3<=x<=1$.

FIG. 2(a) illustrates the energy band diagram and the flow of carriers when an MQB Schottky of the type under consideration having a value of x=0.34 is used for photodiode.

In this case, an effective Schottky barrier height substantially equal to that of $Al_xIn_{1-x}As$ (x=0.48) which is lattice matched to InP and, at the same time, the discontinuity at the valence band edge within the MQB is reduced to a value as small as 0.08 eV.

Note that the structure as described in the above cited Paper No. 3 has a discontinuity of 0.2 eV.

When holes flow toward the Schottky metal by way of the MQB in a conventional device of the type under consideration, the discontinuity at the valence band edge gives rise to a piling up phenomenon to obstruct high-speed response as pointed out in the Paper No. 3. No such problem ever takes place in the above embodiment to a great advantage of the present invention.

While the MQB region is uniformly doped in a device according to the invention, the well layer or the barrier layer may selectively be doped by using an n- or p-type modulation doping technique in order to effectively raise the barrier of the conduction band and lower the barrier of the valence band.

Besides the above cited materials, $GaAs_ySb_{1-y}$ (y=:0.32) can alternatively be used for the purpose of the invention.

If such a material is used, the barrier of the conduction band will become significantly high relative to $Ga_xIn_{1-x}As$ (x=0.47) which is lattice-matched to InP. Thus, a device according to the invention and using such a material for the MQB can safely meet the requirement of a high-effective barrier height and small discontinuity in the valence band edge. Alternatively, $Ga_xIn_{1-x}P$ having a lattice constant |as small as| 1 to 5% smaller than InP can be used for the barrier layer of the MQB.

The MQB structure of the present invention can also be applied not only to Schottky diodes as in the case of the above described embodiments but also to MIS- or SIS-type FETs and HEMTs as well as to Schottky devices involving a substrate made of a material other than InP.

Additionally, the MQB structure of the invention can be realized by using any crystal growth technique capable of controlling ultrathin layers such as MOCVD, gas source MBE or atomic layer epitaxy (ALE).

As is clear from the above description, since a multiquantum barrier Schottky junction device according to the invention comprises a semiconductor and a metal and a multiquantum barrier structure disposed on the interface of said semiconductor and said metal and having an effect of reflecting incident carriers as waves, it can realize a barrier height greater than the Schottky barrier height which is determined by the difference in the electron affinity specific to the material involved and consequently, it can reduce the leakage current of the device. The present invention also provides a Schottky junction device that gives rise to a high forward voltage for the Schottky junction When it is forwardly biased.

What is claimed is:

1. A Schottky device including a Schottky metal and Schottky contact layer consisting of semiconductor materials, wherein said Schottky contact layer includes a multiquantum barrier structure, and wherein said multiquantum barrier consists of strained layer superlattice.

2. A Schottky device including a Schottky metal and Schottky contact layer consisting of semiconductor materials, wherein said Schottky contact layer comprises AlGaAs or GanP and a multiquantum barrier consisting of (In) GaAs/AlGaAs superlattice or (In) GaAs/GaInP superlattice.

3. A Schottky device including a Schottky metal and Schottky contact layer consisting of semiconductor materials, wherein said Schottky contact layer comprises InAl(Ga)As or In(Ga)P and a multiquantum barrier consisting of InGaAs(P)/In(Ga)AlAs superlattice or InGaAs(P)/InGaAsP superlattice.

* * * * *